United States Patent [19]
Goldblatt

[11] Patent Number: 6,144,231
[45] Date of Patent: Nov. 7, 2000

[54] HIGH SPEED DYNAMIC LATCH COMPARATOR

[76] Inventor: Jeremy Mark Goldblatt, 5136 Ellsworth St., San Diego, Calif. 92110

[21] Appl. No.: 09/198,040

[22] Filed: Nov. 23, 1998

[51] Int. Cl.[7] .............................. G01R 19/00; G11C 7/00
[52] U.S. Cl. ................................. 327/57; 327/65
[58] Field of Search ........................ 327/55, 57, 64–68, 327/76–82, 89; 365/205, 207, 208

[56] References Cited

U.S. PATENT DOCUMENTS

| | | | |
|---|---|---|---|
| 5,793,551 | 8/1998 | Ngo et al. .................................. | 327/67 |
| 5,821,792 | 10/1998 | Miwa ....................................... | 327/215 |
| 5,854,562 | 12/1998 | Toyoshima et al. ....................... | 327/55 |
| 5,936,432 | 8/1999 | Oh et al. ................................... | 327/57 |
| 5,982,692 | 11/1999 | Kattunire et al. ......................... | 327/57 |

OTHER PUBLICATIONS

Article "A 10b, 20Msample/s, 35 mW Pipeline AD Converter", by Cho it al., IEEE, 1995 (7 pages).

*Primary Examiner*—My-Trang Nuton
*Attorney, Agent, or Firm*—Philip R. Wadsworth; Charles D. Brown; Christopher O. Edwards

[57] ABSTRACT

A dynamic latching comparator is provided for use with first and second signal input lines. The dynamic latching comparator includes latching circuitry having first and second pull-up devices connected, respectively, between first and second nodes and a high voltage source and first and second pull-down devices connected, respectively, between the first and second nodes and a ground. The first and second pull-down devices have gates connected, respectively, to the first and second input lines. A gate of the first pull-up device is cross-coupled to the second node. A gate of the second pull-up device is cross-coupled to the first node. The dynamic latching comparator also includes differential amplifier circuitry having third and fourth pull-down devices connected, respectively, between the first and second nodes and the ground. A gate of the third pull-down device is cross-coupled to the second node. A gate of the fourth pull-down device cross-coupled to the first node. The third and fourth pull-down devices have a transconductance therebetween equal to about half a transconductance between the first and second pull-down devices. With this configuration, high accuracy and high speed is achieved despite possible process variations while nevertheless lowering input capacitance and thereby permitting operation using reduced power.

11 Claims, 2 Drawing Sheets

HIGH SPEED DYNAMIC LATCH COMPARATOR

BACKGROUND OF THE INVENTION

I. Field of the Invention

The invention generally relates to integrated circuits and in particular to dynamic latching comparators for use therein.

II. Description of the Related Art

Dynamic latching comparators are commonly employed within integrated circuits for comparing a pair of input signals and outputting a signal that is a function of the result of the comparison. Typically, the comparator outputs a signal indicating which of the pair of input signals is greater. Dynamic latching comparators are used, for example, in analog-to-digital (A/D) converters, such as those used within digital wireless telephones.

FIG. 1 illustrates a simple dynamic latching comparator 10. Comparator 10 includes a pair of primary pull-down (nmos) devices 12 (m2) and 14 (m1) having gates connected, respectively, to a pair of input lines 16 and 18. Pull-down device 12 is connected between a node A and ground. Pull-down device 14 is connected between a node B and ground. A pair of capacitors 20 and 22 also connect nodes A and B, respectively, and ground. A pair of cross-coupled pull-up (pmos) devices 24 (m4) and 26 (m3) connect nodes A and B, respectively, to a high voltage source $V_{DD}$. A gate of pull-up device 24 is cross-coupled to node B and a gate of pull-up device 26 is cross-coupled to node B.

Dynamic latching comparator 10 operates to determine whether an input signal asserted on input line 16 is greater than an input signal asserted on line 18 as follows. Initially, nodes A and B are both set to $V_{DD}$. Upon assertion of suitable input signals to the gates of pull-down devices 12 and 14, device 12 begins to pull down the voltage at node A toward ground while device 14 begins to pull down the voltage at node B toward ground. The rate at which the voltage of each node is pulled down is a function of the voltage level of the input signals asserted on the respective pull-down devices. The relative difference between the voltage of A and B is attributed to the transconductance (gm) of the devices, with a higher voltage causing a quicker reduction of voltage at the node. Hence, assuming the gm's of pull-down devices 12 and 14 are the same, then the pull-down device seeing a higher input voltage will pull-down the voltage at its respective node faster. Thus, a "race" occurs. Eventually, a threshold is reached on one of the nodes causing the corresponding cross-coupled pull-up device to be activated. The threshold occurs when the current in the pull-down device equals that of the corresponding pull-up device, i.e. when the current through device 12 equals that of device 24 or when the current through device 14 equals that of device 26. If node A reaches the threshold first, then pull-up device 26 is activated, otherwise pull-up device 24 is activated first. The pull-up devices are of sufficient size to override the pull-down effect of the corresponding pull-down device and thereby cause the node connected to the drain of the pull-up device to be pulled back up to $V_{DD}$. Hence, if node A reaches its respective threshold first, then pull-up device 26 is activated causing node B to be pulled up to $V_{DD}$ despite the opposing effect of pull-down device 14. Also, with node A connected to the gate of pull-up device 26, pull-up device 26 is thereby prevented from activating. Alternatively, if node B reaches its respective threshold first, then pull-up device 24 is activated causing node A to be pulled up to $V_{DD}$ despite the opposing effect of pull-down device 12. Also, with node B connected to the gate of pull-up device 24, pull-up device 24 is thereby prevented from activating.

Thus, if the input signal asserted on input line 16 has a lower voltage than that of input line 18, node A is eventually pulled down to ground and node B returns to $V_{DD}$. If the input signal asserted on input line 18 has a lower voltage than that of input line 16, node B is eventually pulled down to ground and node A returns to $V_{DD}$. Output signal lines, not shown, connected to nodes A and B thereby output a signal representative of whether the input signal along line 16 is lower than that or line 18 or vice versa.

FIG. 2 illustrates a dynamic latching comparator with reset circuitry. As with the comparator of FIG. 1, comparator 110 of FIG. 2 includes a pair of primary pull-down devices 112 (m2) and 114 (m1) cross-coupled to a pair of pull-up devices 124 (m4) and 126 (m3). Input lines 116 and 118 are connected to respective gates of the pull-down devices. Capacitors 120 and 122 are also provided. Additionally, comparator 110 includes reset circuitry including pull-up devices 128 (m6) and 130 (m5) connected in parallel with pull-up devices 124 and 126 between $V_{DD}$ and nodes A and B, respectively. Gates of pull-up devices 128 and 130 are connected to a reset line 131. The reset circuitry also includes additional devices 132 (m8) and 134 (m7) connected between pull-down devices 112 and 114 and nodes A and B, respectively. These devices operate as switches to prevent current flow. Gates of switch devices 132 and 134 are also connected to reset line 131. The devices of the reset circuitry are sized such that, upon assertion of an active low reset signal on the reset line, the voltage levels of nodes A and B are returned to $V_{DD}$ despite opposing effects of the other devices of the overall comparator and such that current flow is prevented while the comparator is in the reset state. To prevent current flow after a latch has been achieved but before a reset signal is asserted, yet another pair of switch devices 136 (m10) and 138 (m9) is provided. Switch devices 136 and 138 are connected, respectively, between pull-down device 112 and accompaning switch 132 and pull-down device 114 and accompaning switch 134. Output lines, not shown, may be connected to nodes A and B to output a signal representative of whether the input signal along line 116 is lower than that or line 118 or vice versa.

For most applications, it is desirable to configure the comparator to provide the quickest possible comparison of the input signals, and the various devices of the comparator are sized and positioned accordingly. Additionally, though, it is necessary to ensure that a correct comparison is made despite possible process variations between the devices of the comparator. In this regard, if the pull-down devices connected to the input lines are too small, then process variations between those devices could cause the pull-down device seeing a lower voltage input signal to nevertheless win the aforementioned "race" causing an incorrect output signal to be generated. More specifically, a voltage error (err) or mismatch can occur at the time the latching threshold is reached. The error occurs primarily as a result in current differences between the primary pull-down devices due to variances in gate threshold voltage (vt) and susceptance (B). The voltage error may be derived using the following equations (with the various terms in the equations having their standard definitions in the art):

$$B = \mu_n Cox \frac{W}{L}$$

-continued $$I(PathA) = B2 \cdot (vgs2 - vt2)^2$$

$$I(PathB) = B1 \cdot (vgs1 - vt1)^2$$

$$I = c \cdot \frac{dv}{dt}$$

$$VDD - vds1 = I(PathB) \cdot \frac{dt}{c}$$

$$\frac{dt}{c} = \frac{VDD - vds1}{B1 \cdot (vgs1 - vt1)^2}$$

$$\frac{vdd - vds1}{B1 \cdot (vgs1 - vt1)^2} = \frac{Vdd - vds2}{B2 \cdot (vgs2 - vt2)^2}$$

$$V1 = VDD - vds1$$

$$V2 = VDD - vds2$$

$$vgs1 = vgs2$$

$$V1 = V2 \cdot \left( \frac{B1(vgs - vt1)^2}{B2(vgs - vt2)^2} \right)$$

$$V2 - V1 + err$$

$$err = V2 \cdot \left( 1 - \frac{B1 \cdot (vgs - vt1)^2}{B2 \cdot (vgs - vt2)^2} \right)$$

To minimize the voltage error and thereby ensure accuracy despite process variations, the pull-down devices connected to the input lines are typically made relatively wide and long. This, however, slows the comparison time. Comparison time is related to the gm between the pull-down devices which is reduced when the pull-down devices are made larger. Moreover, the larger pull-down devices yield a larger input capacitance thereby requiring more power for operation, particularly insofar as driver devices (not shown), used to assert input signals onto the input lines, are concerned. Hence, to overcome process variations, higher overall power is required and the comparison rate is reduced. A slower comparison rate is almost always undesirable, and for many applications, such as A/D converters used in battery-powered wireless telephones, a higher power requirement is particularly disadvantageous.

Hence, it would be highly desirable to provide an improved dynamic latching comparator that achieves a fast comparison rate with relatively low input capacitance and it is to that end that aspects of the invention are primarily directed.

SUMMARY OF THE INVENTION

In accordance with the invention, a dynamic latching comparator is provided for connection to first and second signal input lines. The dynamic latching comparator includes latching circuitry having first and second pull-up devices connected, respectively, between first and second nodes and a positive voltage source and first and second pull-down devices connected, respectively, between the first and second nodes and a ground. The first and second pull-down devices have gates connected, respectively, to the first and second input lines. A gate of the first pull-up device is cross-coupled to the second node. A gate of the second pull-up device is cross-coupled to the first node. The dynamic latching comparator also includes differential amplifier circuitry having third and fourth pull-down devices connected, respectively, between the first and second nodes and the ground. A gate of the third pull-down device is cross-coupled to the second node. A gate of the fourth pull-down device cross-coupled to the first node.

In an exemplary embodiment, the third and fourth pull-down devices have a transconductance therebetween equal to about half a transconductance between the first and second pull-down devices. The differential amplifier circuitry further includes a current source connected between the third and fourth pull-down devices and ground. The latching circuitry further includes a first switch device connected between the first pull-down device and the first node and a second pull-down device connected between the second pull-down device and the second node. The differential amplifier circuitry further includes a first buffer connected between gates of the third pull-down device and its accompaning switch and a second buffer connected between gates of the fourth pull-down device and its accompaning switch.

Also in the exemplary embodiment, the dynamic latching comparator includes reset circuitry which includes a seventh pull-down device connected between the third and fourth pull-down devices and ground and having a gate connected to a reset line. Third and fourth pull-up devices are connected, respectively, between the first and second nodes and the high voltage source. The third and fourth pull-up devices have respective gates connected to the reset line. The reset circuitry also includes third and fourth switch devices connected, respectively, between the first and second switch devices and the first and second nodes. The third and fourth switch devices have respective gates also connected to the reset line.

By providing the differential amplifier circuitry as described, high accuracy and high comparison rates are achieved despite possible process variations while nevertheless maintaining low input capacitance and thereby permitting operation using reduced power. Other features and advantages of the invention are described below.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
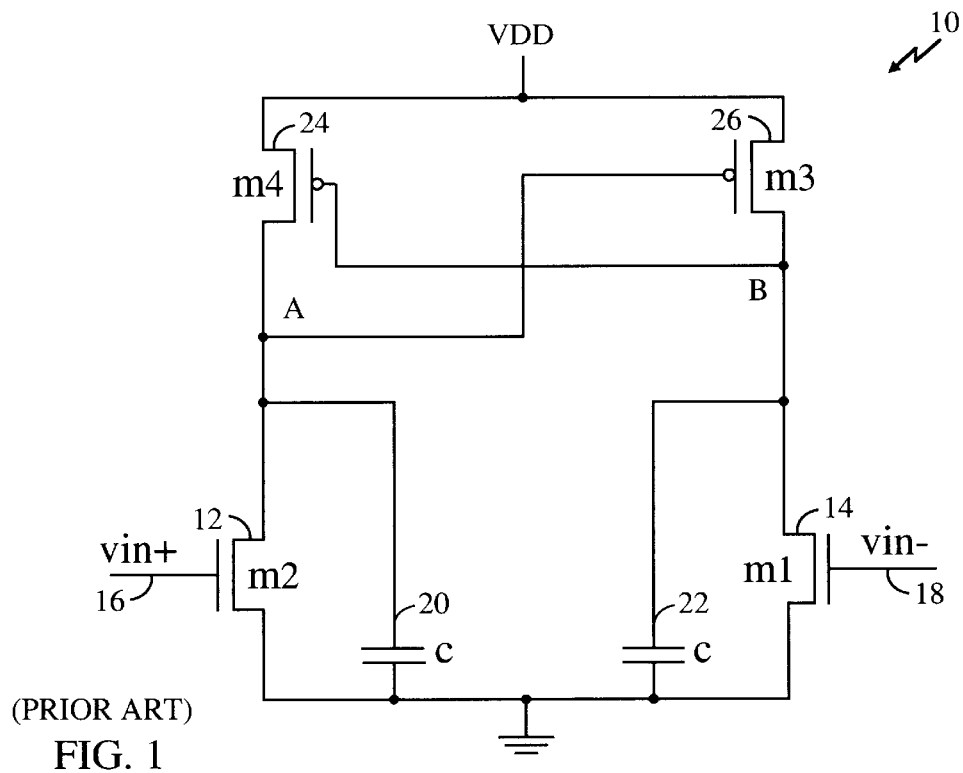
FIG. 1 illustrates a simplified conventional dynamic latching comparator.
Figure 2:
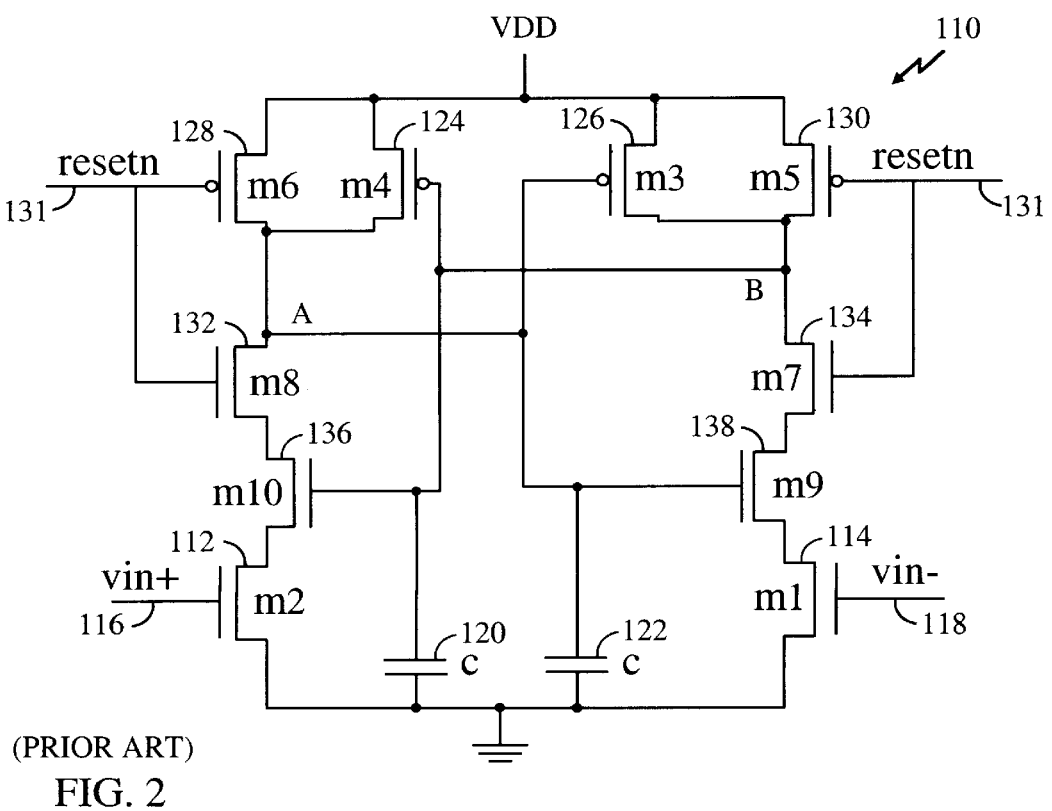
FIG. 2 illustrates a standard conventional dynamic latching comparator with reset circuitry.
Figure 3:
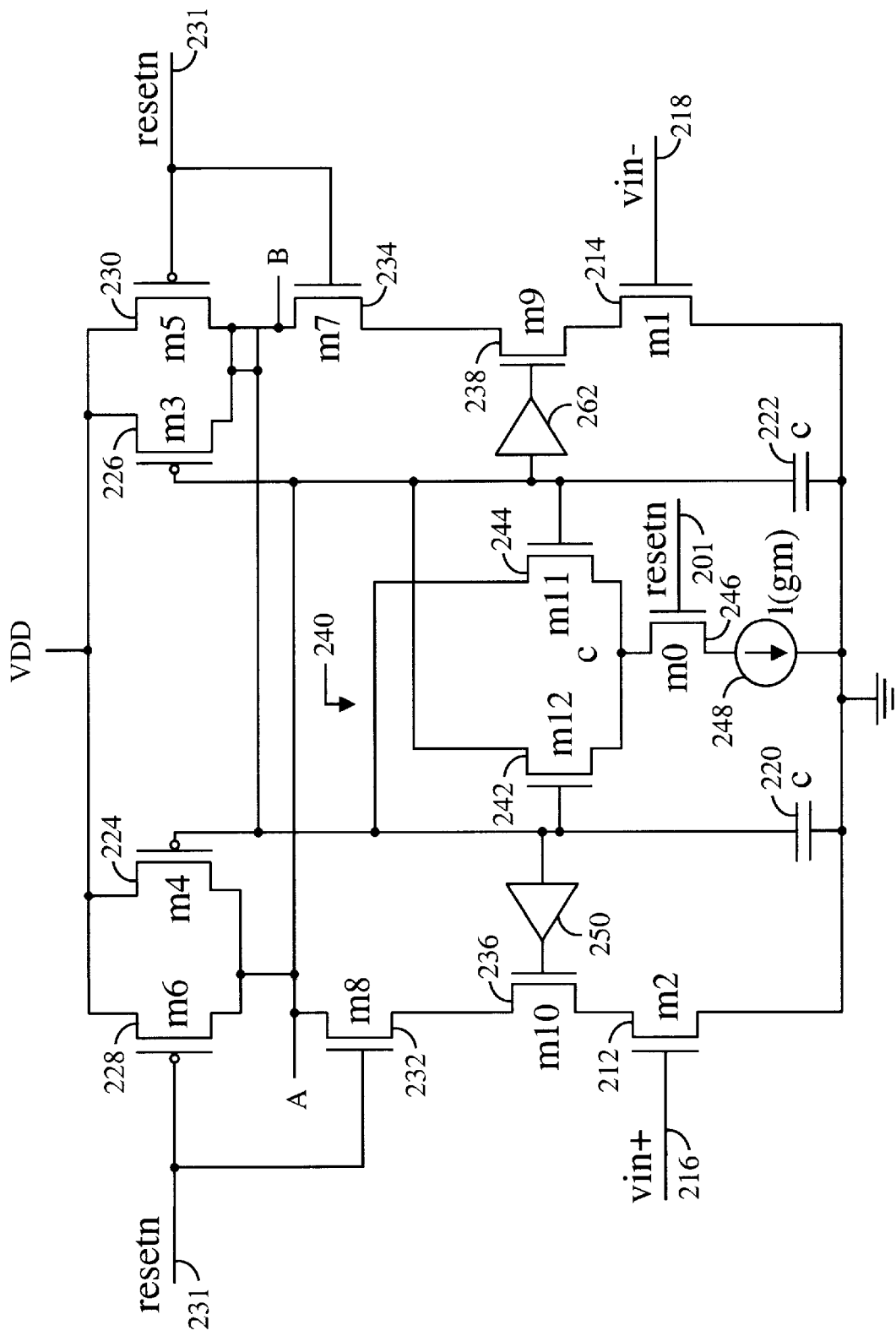
FIG. 3 illustrates a dynamic latching comparator configured in accordance with an exemplary embodiment of the invention.

With reference to FIG. 3, an exemplary embodiment of the invention will now be described. FIG. 3 illustrates a dynamic latching comparator 210 having a differential amplifier for increasing a comparison rate while providing high accuracy despite possible process variations while nevertheless maintaining a low input capacitance and thereby permitting operation using relatively low power.

Comparator 210 includes a pair of primary pull-down devices 212 (m2) and 214 (m1) having gates connected, respectively, to a pair of input lines 216 and 218. Pull-down device 212 is connected between a node A and ground. Pull-down device 214 is connected between a node B and ground. A pair of capacitors 220 and 222 also connect nodes A and B, respectively, and ground. A pair of cross-coupled pull-up devices 224 (m4) and 226 (m3) connect nodes A and B and a high voltage source $V_{DD}$, respectively. A gate of pull-up device 224 is cross-coupled to node B, and a gate of pull-up device 226 is cross-coupled to node B. Primary pull-down devices 212 and 214 are of sufficient size to be relatively free of significant process variations. Hence, a relatively small voltage error (err) occurs on nodes A and B from the resulting process variations of devices 212 and 214.

Additionally, comparator 210 includes reset circuitry comprising pull-up devices 228 (m6) and 230 (m5) connected in parallel with pull-up devices 224 and 226 between $V_{DD}$ and nodes A and B, respectively. Gates of pull-up devices 228 and 230 are connected to a reset line 231. The reset circuitry also includes switch devices 232 (m8) and 234 (m7) connected in series between pull-down devices 212 and 214 and nodes A and B, respectively. Gates of switch devices 232 and 234 are also connected to reset line 231. The devices of the reset circuitry are sized such that, upon assertion of a active low reset signal on the reset line, the voltage levels of nodes A and B are returned to $V_{DD}$ despite opposing effects of the other devices of the comparator and such that current flow is prevented while the comparator is in the reset state. To prevent current flow after a latch has been achieved but before a reset signal is received, yet another pair of switch devices 236 (m10) and 238 (m9) is provided. Switch devices 236 and 238 are connected, respectively, between devices 212 and 232 and devices 214 and 234. Output lines, not shown, may be connected to nodes A and B.

As described above, process variations between the primary pull-down devices of a dynamic latching comparator can result in an erroneous output signal. To minimize the voltage error and thereby ensure accuracy despite process variations, the primary pull-down devices are made longer, but that can slow the comparison rate and increase the input capacitance of the comparator thereby increasing power requirements. To increase the comparison rate while maintaining a low input capacitance, a differential amplifier 240 provided. Differential amplifier 240 includes secondary pull-down devices 242 (m11) and 244 (m12), with device 242 connected between node A and a node C and with device 244 connected between node B and node C. A power source 248 and another reset pull-down device 246 are connected between node C and ground. A gate of device 246 is connected to reset line 231. A gate of secondary pull-down device 242 is connected through a buffer 250 to a gate of switch device 232. A gate of secondary pull-down device 244 is connected through a buffer 252 to a gate of switch device 234. The buffers are two inverters cascaded to eliminate loading on nodes A and B. More specifically, the buffers are used to electrically isolate nodes A and B from the gates of devices 238 and 236, respectively.

In use, with the reset signal set to an inactive high level, dynamic latching comparator 210 operates to determine whether an input signal asserted on input line 216 is lower than an input signal asserted on line 218 as follows. Initially, nodes A and B are both set to $V_{DD}$. Upon assertion of suitable input signals to the gates of primary pull-down devices 212 and 214, device 212 begins to pull down the voltage at node A toward ground while device 214 begins to pull down the voltage at node B toward ground. The differential amplifier amplifies any voltage differential between nodes A and B. In particular, the speed at which the voltage of each node is pulled-down is a function of the voltage level of the input signals asserted on the respective primary pull-down devices. The relative difference between the voltage of A and B is attached to the input referred transconductance (gm) of those devices as modified by the effect of the differential amplifier. The primary pull-down device seeing a lower input voltage will pull-down the voltage at its respective node faster. Eventually, a threshold is reached on one of the nodes causing the corresponding cross-coupled pull-up device to be activated. The threshold occurs when the current in the pull-down device equals that of the corresponding pull-up device, i.e. when the current through device 214 equals that of device 226 or when the current through device 216 equals that of device 224. If node A reaches the threshold first, then pull-up device 226 is activated, otherwise pull-up device 224 is activated first. The pull-up devices are of sufficient size to override the pull-down effect of the corresponding pull-down device and thereby cause the node connected to the drain of the pull-up device to be pulled back up to $V_{DD}$. Hence, if node A reaches its respective threshold first, then pull-up device 226 is activated causing node B to be pulled up to $V_{DD}$ despite the opposing effect of pull-down device 214. Alternatively, if node B reaches its respective threshold first, then pull-up device 224 is activated causing node A to be pulled up to $V_{DD}$ despite the opposing effect of pull-down device 212.

Thus, if the input signal asserted on input line 216 has a lower voltage than that of input line 218, node B is eventually pulled-down to ground and node A remains at $V_{DD}$. If the input signal asserted on input line 218 has a lower voltage than that of input line 216, node A is eventually pulled-down to ground and node B remains at $V_{DD}$. Output signal lines, not shown, connected to nodes A and B thereby output a signal representative of whether the input signal along line 216 is greater than that or line 218 or vice versa.

Thus, differential amplifier 240 operates to amplify the voltage differential created between nodes A and B as a result of a differential in the voltages of signals asserted on the input lines thereby increasing the comparison rate. Additionally, the differential amplifier increases the effective gm of the primary pull-down devices thereby reducing input capacitance even though the primary pull-down devices are of sufficiently large size to swamp process variations. The increase in effective (or input referred) gm may be established as follows (with the various terms in the equations having their standard definitions in the art):

$$I(PathA) = c \cdot \frac{d(VA)}{dt} \approx c \cdot \frac{VDD - VA}{\Delta t}$$

$$I(PathB) = c \cdot \frac{dVB}{dt} \approx c \cdot \frac{VDD - VB}{\Delta t}$$

$$gm_{1,2} \cdot \Delta vgs_{1,2} = I(PathA) - I(PathB) = \Delta I = c \frac{VB - VA}{\Delta t}$$

$$\frac{I(PathA) + I(PathB)}{2} = I = c \frac{VDD - \frac{VB + VA}{2}}{\Delta t}$$

$$VB - VA = \frac{\Delta t \cdot \Delta vgs_{1,2} \cdot gm_{1,2}}{c} = \frac{VDD - \frac{VB + VA}{2}}{I} \Delta vgs_{1,2} \cdot gm_{1,2}$$

$$gm_{1,2} = \sqrt{2 \cdot B \cdot I}$$

$$I = \frac{gm_{1,2}^2}{2 \cdot B}$$

$$B = \mu_n Cox \frac{W}{L}$$

$$VB - VA = \frac{VDD - \frac{VB + VA}{2}}{gm_{1,2}} \Delta vgs_{1,2} \cdot 2 \cdot B$$

-continued $$VB - VA = \frac{VDD - \frac{VB + VA}{2}}{\left(\frac{vgs_1 + vgs_2}{2} - vt\right)} \Delta vgs_{1,2}$$

We want a comparison to be made when the output common mode $$\frac{VB + VA}{2} \approx \frac{VDD}{2}$$

Therefore the voltage gain as seen at the inputs of devices 244 and 242 is:

$$\frac{VB - VA}{\Delta vgs_{1,2}} = Av = \frac{VDD}{vgs_{1,2} + vgs_{1,2} - 2 \cdot vt}$$

Therefore the input referred gm is given by:

$$gm_{total} = Av \cdot gm_{11/12} + gm_{1,2}$$

Hence, the overall effective (input referred) gm of the comparator is increased and high comparison accuracy is achieved at a high comparison rate while requiring relatively little overall power because the effective input capacitance is low.

The sizes of the devices of the differential amplifier are chosen to provide a gm between secondary pull-down devices 242 and 244 that is about one half of the gm between primary pull-down devices 212 and 214. This is provided to ensure that the gm of the secondary devices does not appreciably counter the gm of the primary devices immediately after the reset signal is negated which might otherwise prevent correct operation of the circuit.

Table I provides exemplary device sizes for one specific embodiment constructed in accordance with the schematic of FIG. 3. In other embodiments, other device sizes are appropriate.

TABLE I

| Device Number | Device Size (W/L) |
|---|---|
| pull-down device 212 (m1) | 24µ/3.6µ |
| pull-down device 214 (m2) | 24µ/3.6µ |
| capacitor 220 | .25 p |
| capacitor 222 | .25 p |
| pull-up device 224 (m4) | 96µ/1.35µ |
| pull-up device 226 (m3) | 96µ/1.35µ |
| pull-up device 228 (m6) | 9.6µ/.6µ |
| pull-up device 230 (m5) | 9.6µ/.6µ |
| switch device 232 (m8) | 24µ/.6µ |
| switch device 234 (m7) | 24µ/.6µ |
| switch device 236 (m10) | 12µ/.6µ |
| switch device 238 (m9) | 12µ/.6µ |
| pull-down device 242 (m12) | 10.5µ/1.95µ |
| pull-down device 244 (m11) | 10.5µ/1.95µ |
| pull-down device 246 (m0) | 9.6µ/.6µ |

With the device sizes of Table I, current source 248 is preferably configured to provide a current of 0.3 mAmps.

Thus an improved dynamic latching comparator has been described that achieves a fast comparison rate with high accuracy and with relatively low input capacitance and that is substantially immune to process variations.

The exemplary embodiments have been primarily described with reference to schematic diagrams illustrating pertinent features of the embodiments. It should be appreciated that not all components of a complete implementation of a practical system are necessarily illustrated or described in detail. Rather, only those components necessary for a thorough understanding of the invention have been illustrated and described in detail. Actual implementations may contain more components or, depending upon the implementation, may contain fewer components.

The description of the exemplary embodiments is provided to enable any person skilled in the art to make or use the present invention. Various modifications to these embodiments will be readily apparent to those skilled in the art and the generic principles defined herein may be applied to other embodiments without the use of the inventive faculty. Thus, the invention is not intended to be limited to the embodiments shown herein but is to be accorded the widest scope consistent with the principles and novel features disclosed herein.

What is claimed is:

1. A dynamic latching comparator interconnecting first and second signal input lines, said latching comparator comprising:

latching circuitry comprising first and second pull-up devices connected, respectively, between first and second nodes and a positive voltage source and first and second pull-down devices operatively connected, respectively, between the first and second nodes and a ground, with the first and second pull-down devices having gates connected, respectively, to the first and second input lines, and with a gate of the first pull-up device cross-coupled to the second node, and with a gate of the second pull-up device cross-coupled to the first node; and differential amplifier circuitry comprising third and fourth pull-down devices connected, respectively, between the first and second nodes and the ground, and with a gate of the third pull-down device cross-coupled to the second node, and with a gate of the fourth pull-down device cross-coupled to the first node.

2. The dynamic latching comparator of claim 1 wherein said third and fourth pull-down devices having a transconductance therebetween equal to about half a transconductance between said first and second pull-down devices.

3. The dynamic latching comparator of claim 1 wherein the differential amplifier circuitry further includes:

a current source connected between said third and fourth pull-down devices and ground.

4. The dynamic latching comparator of claim 1 further including reset circuitry.

5. The dynamic latching comparator of claim 4 wherein said reset circuitry comprises:

a seventh pull-down device connected between said third and fourth pull-down devices and ground and having a gate connected to a reset line;

third and fourth pull-up devices connected, respectively, between the first and second nodes and the high voltage source, and with the third and fourth pull-up devices having respective gates connected to the reset line;

third and fourth switch devices connected, respectively, between the first and second switch devices and the first and second nodes, and with the third and fourth switch devices having respective gates also connected to the reset line.

6. A dynamic latching comparator interconnecting first and second signal input lines, said latching comparator comprising:

means for performing a comparison of voltage levels on the first and second input lines by producing a voltage differential between a pair of first and second nodes with the voltage differential representative of a difference in voltage levels on the input lines, said means comprising latching circuitry including first and second pull-up devices connected, respectively, between first and second nodes and a high voltage source and first and second pull-down devices operatively connected, respectively, between the first and second nodes and a ground, with the first and second pull-down devices having gates connected, respectively, to the first and second input lines, and with a gate of the first pull-up device cross-coupled to the second node, and with a gate of the second pull-up device cross-coupled to the first node; and differential amplifier means for amplifying the voltage differential between the first and second nodes.

7. The dynamic latching comparator of claim 6 wherein the differential amplifier means comprises:

differential amplifier circuitry comprising third and fourth pull-down devices connected, respectively, between the first and second nodes and the ground, and with a gate of the third pull-down device cross-coupled to the second node, and with a gate of the fourth pull-down device cross-coupled to the first node.

8. The dynamic latching comparator of claim 7 wherein said third and fourth pull-down devices having a transconductance therebetween equal to about half a transconductance between said first and second pull-down devices.

9. The dynamic latching comparator of claim 7 wherein the differential amplifier circuitry further includes:

a current source connected between said third and fourth pull-down devices and ground.

10. The dynamic latching comparator of claim 7 further including reset circuitry.

11. The dynamic latching comparator of claim 10 wherein said reset circuitry comprises:

a seventh pull-down device connected between said third and fourth pull-down devices and ground and having a gate connected to a reset line;

third and fourth pull-up devices connected, respectively, between the first and second nodes and the high voltage source, and with the third and fourth pull-up devices having respective gates connected to the reset line;

third and fourth switch devices connected, respectively, between the first and second switch devices and the first and second nodes, and with the third and fourth switch devices having respective gates also connected to the reset line.

* * * * *